United States Patent [19]
Ino et al.

[11] Patent Number: 5,400,023
[45] Date of Patent: Mar. 21, 1995

[54] MODULATING METHOD AND DEMODULATING METHOD AS WELL AS MODULATING APPARATUS AND DEMODULATING APPARATUS

[75] Inventors: Hiroyuki Ino, Tokyo; Yoshihide Shimpuku, Kanagawa; Yasuyuki Chaki, Chiba; Toshiyuki Nakagawa, Kanagawa, all of Japan

[73] Assignee: Sony Corporation, Tokyo, Japan

[21] Appl. No.: 29,133

[22] Filed: Mar. 10, 1993

[30] Foreign Application Priority Data

| Mar. 10, 1992 | [JP] | Japan | 4-086404 |
| May 21, 1992 | [JP] | Japan | 4-154425 |
| May 25, 1992 | [JP] | Japan | 4-157559 |

[51] Int. Cl.⁶ .................................. H03M 7/46
[52] U.S. Cl. ........................ 341/59; 341/58; 341/106
[58] Field of Search .............. 341/58, 59, 67, 95, 341/106; 360/40, 41

[56] References Cited

U.S. PATENT DOCUMENTS

| 4,348,659 | 9/1982 | Fujimori et al. | 341/58 |
| 4,914,438 | 4/1990 | Kameyama | 341/59 |
| 4,985,700 | 1/1991 | Mikami | 341/59 |
| 5,034,742 | 7/1991 | Bond et al. | 341/67 |
| 5,138,314 | 8/1992 | Shimpuku et al. | 341/58 |
| 5,138,316 | 8/1992 | Konishi | 341/67 |
| 5,173,694 | 12/1992 | Lynch, Jr. et al. | 341/59 |

FOREIGN PATENT DOCUMENTS

| 0329533A1 | 8/1989 | European Pat. Off. . |
| 0442548A1 | 8/1991 | European Pat. Off. . |
| 0467678A2 | 1/1992 | European Pat. Off. . |
| 3602808A1 | 8/1987 | Germany . |

*Primary Examiner*—Howard L. Williams
*Attorney, Agent, or Firm*—Limbach & Limbach; J. William Wigert, Jr.

[57] ABSTRACT

A modulating method and apparatus and a demodulating method and apparatus in which a variable length code (d, k;m, n;r) which can provide a greater minimum reversal distance to allow recording of a higher density than ever is provided. According to the modulating method and apparatus, digital data of a basic data length of m bits is modulated into a variable length code (d, k;m, n;r) of a basic code length of n bits, and where the distance between adjacent ones of the digital data is represented by T, the minimum reversal distance of the variable length code is equal to or greater than 2.0 T and the minimum length of a run of a same symbol is equal to or greater than 4. The demodulating apparatus demodulates the digital data back into the variable length code and comprises storage means for storing therein a plurality of tables for converting the digital data into the variable length code, discriminating means for discriminating the binding length of the digital data, and selecting means for selecting one of the tables in accordance with a result of discrimination of the discriminating means.

27 Claims, 17 Drawing Sheets

FIG. 1

|   |   |   |   |   |   |
|---|---|---|---|---|---|
| 1 | 1 | 0 | 0 | 0 | 0 |
| 2 | 0 | 1 | 0 | 0 | 0 |
| 3 | 0 | 0 | 1 | 0 | 0 |
| 4 | 0 | 0 | 0 | 1 | 0 |
| 5 | 0 | 0 | 0 | 0 | 1 |
| 6 | 0 | 0 | 0 | 0 | 0 |

FIG. 2

| BASIC CODE | r | N | M | D |
|---|---|---|---|---|
| (2,5) | 1 | 4 | 2 | 2 |
| (2,5) | 2 | 8 | 4 | 4 |
| (2,5) | 3 | 16 | 9 | 7 |
| (2,5) | 4 | 28 | 20 | 8 |
| (2,5) | 5 | 32 | 34 | -2 |

FIG. 3

| | DATA | CODE | |
|---|---|---|---|
| r=1 | 11<br>10 | 00000<br>10000 | |
| r=2 | 0111<br>0110<br>0101<br>0100 | 01000 00000<br>01000 00000<br>00010 00000<br>00001 00000 | |
| r=3 | 001111<br>001110<br>001101<br>001100<br>001011<br>001010<br>001001<br>001000<br>001111 | 01000 01000 00000<br>01000 00100 00000<br>01000 00010 00000<br>01000 00001 00000<br>00100 01000 00000<br>00100 00010 00000<br>00100 00001 00000<br>00010 01000 00000<br>00001 01000 00000 | |
| r=4 | 00011011<br>00011010<br>00011001<br>00011000<br>00010111<br>00010110<br>00010101<br>00010100<br>00010011<br>00010010<br>00010001<br>00010000<br>00001111<br>00001110<br>00001101<br>00001100<br>00001011<br>00001010<br>00001001<br>00001000 | 01000 01000 01000 00000<br>01000 01000 00100 00000<br>01000 01000 00010 00000<br>01000 01000 00001 00000<br>01000 00100 00100 00000<br>01000 00100 00010 00000<br>01000 00100 00001 00000<br>01000 00010 00010 00000<br>01000 00010 00001 00000<br>01000 00001 00001 00000<br>00100 00100 00100 00000<br>00100 00100 00010 00000<br>00100 00100 00001 00000<br>00100 00010 00010 00000<br>00100 00010 00001 00000<br>00100 00001 00001 00000<br>00010 00010 00010 00000<br>00010 00010 00001 00000<br>00010 00001 00001 00000<br>00001 00001 00001 00000 | | r=5

(large table of 5-group binary codes)

FIG. 4

| BASIC CODE | r | N | M | D |
|---|---|---|---|---|
| (2,5) | 1 | 4 | 2 | 2 |
| (2,5) | 2 | 8 | 4 | 4 |
| (2,5) | 3 | 16 | 10 | 6 |
| (2,5) | 4 | 24 | 20 | 4 |
| (2,5) | 5 | 16 | 35 | -19 |

FIG. 5

| CODE | Tmin | Tmax | Tw | Tmin*Tw | Tmax/Tmin |
|---|---|---|---|---|---|
| EFM | 1.41T | 5.18T | 0.47T | 0.663 | 3.7 |
| 3Z | 1.78T | 7.11T | 0.44T | 0.78 | 4 |
| VFM | 2.0T | 9.2T | 0.4T | 0.8 | 4.6 |

FIG. 10

|   | 2-4 BASIC CODE | | | |
|---|---|---|---|---|
| 1 | 1 | 0 | 0 | 0 |
| 2 | 0 | 1 | 0 | 0 |
| 3 | 0 | 0 | 1 | 0 |
| 4 | 0 | 0 | 0 | 1 |
| 5 | 0 | 0 | 0 | 0 |

FIG. 11

|   | 2-5 BASIC CODE | | | | |
|---|---|---|---|---|---|
| 1 | 1 | 0 | 0 | 0 | 0 |
| 2 | 0 | 1 | 0 | 0 | 0 |
| 3 | 0 | 0 | 1 | 0 | 0 |
| 4 | 0 | 0 | 0 | 1 | 0 |
| 5 | 0 | 0 | 0 | 0 | 1 |
| 6 | 1 | 0 | 0 | 0 | 1 |
| 7 | 0 | 0 | 0 | 0 | 0 |

FIG. 12

| BASIC CODE | r | N | M | D |
|---|---|---|---|---|
| (2,4) | 1 | 4 | 2 | 2 |
| (2,5) | 2 | 8 | 5 | 3 |
| (2,4) | 3 | 12 | 9 | 3 |
| (2,5) | 4 | 12 | 18 | -6 |

FIG. 13

| BASIC CODE | r | N | M | D |
|---|---|---|---|---|
| (2,4) | 1 | 4 | 2 | 2 |
| (2,5) | 2 | 8 | 5 | 3 |
| (2,4) | 3 | 12 | 8 | 4 |
| (2,5) | 4 | 16 | 17 | -1 |

2-5 (ffmod2to5d3)

| | DATA | CODE |
|---|---|---|
| r=1 | 11<br>10<br><br>01 | 00000<br>10000<br><br>01000 |
| r=2 | 1111<br><br>0011<br>0010 | 00001 0000<br><br>00100 0000<br>00010 0000 |
| r=3 | 000111<br>000110<br>000101<br>000100<br><br>000011<br>000010 | 00100 0100 00000<br>00100 0100 01000<br>00100 0010 00000<br>00100 0001 00000<br><br>00010 0010 00000<br>00010 0001 00000 |
| r=4 | 00000111<br>00000110<br>00000101<br>00000100<br><br>00000011<br>00000010<br>00000001<br>00000000 | 00100 0100 01000 0000<br>00100 0100 00100 0000<br>00100 0100 00010 0000<br>00100 0100 00001 0000<br><br>00010 0010 00100 0000<br>00010 0010 00010 0000<br>00010 0010 00001 0000<br>00010 0001 00010 0000<br><br>00001 0001 00010 0000<br>00001 0001 00001 0000 |

FIG. 16

| Tmin | Tmax | Tw | Tmax/Tmin |
|---|---|---|---|
| 1.78T | 7.1T | 0.44T | 4 |

FIG. 18(a) HEX             18D2   TABLE 5    TABLE 7   TABLE 7   TABLE 5

FIG. 18(b) DATA (BINARY)   0 0 0 1   1 0 0 0   1 1 0 1   0 0 1 0

FIG. 18(c) CONVERSION DATA   (2-4)       (2-5)       (2-4)       (2-5)       (2-4)       (2-5)
                             0000   1000   000000   100000   000000   01000

FIG. 18(d) DELIMITATION       TABLE 5          TABLE 7        TABLE 7   TABLE 5

FIG. 18(e) RECORDING SIGNAL

FIG. 18(f) CHANNEL CLOCK

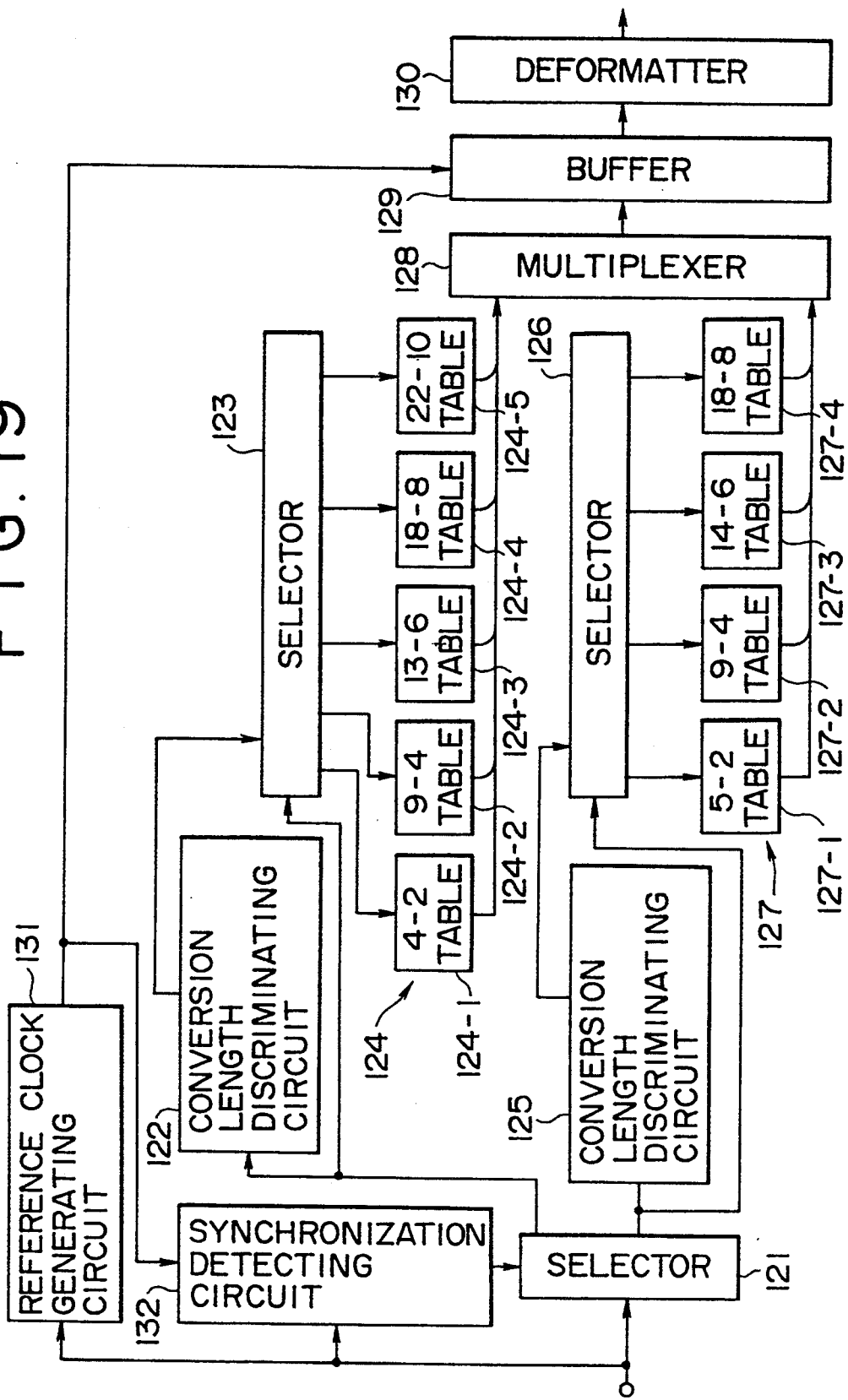

BLOCK BOUNDARY →
(K)

BLOCK BOUNDARY →
(K)

| | DATA | CODE |
|---|---|---|
| r = 1 | 01<br>00 | 00100<br>00010 |
| r = 2 | 0011<br>0010<br>0001<br>0000 | 01000 00100<br>00100 00100<br>01000 01000<br>00010 00001 |
| r = 3 | 000110<br>000101<br>000100<br>000011<br>000010<br>000001<br>000000 | 01000 01000 00100<br>01000 00100 00100<br>00100 00100 00100<br>00100 00001 00001<br>00001 00001 00001<br>01000 01000 00010<br>00100 00100 00010 |
| r = 4 | 00000111<br>00000110<br>00000101<br>00000100<br>00000011<br>00000010<br>00000001<br>00000000 | 01000 01000 01000 00100<br>01000 01000 00100 00100<br>01000 00100 00100 00100<br>01000 00100 00001 00001<br>01000 00001 00001 00001<br>00100 00100 00100 00100<br>00100 00100 00001 00001<br>00010 00010 00001 00001 |

BLOCK BOUNDARY
(K)

MODULATING METHOD AND DEMODULATING METHOD AS WELL AS MODULATING APPARATUS AND DEMODULATING APPARATUS

BACKGROUND OF THE INVENTION

1. Field of the Invention

This invention relates to a modulating method and a demodulating method as well as a modulating apparatus and a demodulating apparatus suitable for use, for example, for digital recording and reproduction of data onto and from a record medium.

Particularly, the modulation code used in the present invention is a variable length code, and recording data in units of m bits is converted into a recording code in units of n bits.

2. Description of the Prior Art

In a magnetic recording system, generally a signal has a differentiation frequency characteristic and suffers from deterioration in a high frequency band. This arises from a loss at a head gap, a loss by a space between a head and a record medium, a loss originating in thickness of a record medium, a low frequency band loss at a rotary transformer and so forth. Further, noise such as crosstalk noise from an adjacent track, noise from a record medium and overwrite noise could make a cause of a random error. Meanwhile, in an optical recording system, the output decreases substantially linearly toward an optical cutoff frequency ($2NA/\lambda$) which depends upon the wavelength of a light source and the numerical aperture of the lens. In order to record and reproduce data accurately irrespective of such losses and noise, digital information should be recorded onto a record medium after it is modulated so that it may be compatible with a recording and reproduction system, which allows a greater amount of information to be recorded stably. To this end, channel coding of data (recording signal) is performed in accordance with a predetermined rule.

One of such channel coding methods is block coding. The block coding involves dividing a data sequence into blocks of $m \times i$ bits and converting each data word into a channel code of $n \times i$ channel bits in accordance with a predetermined coding rule. When $i=1$, the channel code is a fixed length code, but when i is greater than 1 and the binding length r is greater than 1, the channel code is a variable length code. The block code is also called (d, k;m, n;r) code. Here, d is a minimum run number of 0 while k is a maximum run number of 0.

The block coding is disclosed in Japanese Patent Laid-Open Application No. Heisei 01-221919, laid open on Sep. 5, 1989, under the title of "Variable Length Code Converting Method". According to the variable length code converting method, the run numbers of 0 at the beginning and last ends of a code word are restricted and a uniformly decodable code word is selected. Consequently, a code having a minimum magnetization reversal distance (Tmin) which is 1.33 times that of a conventional (2, 7) RLL code and is twice that of the MFM.

In particular, according to the variable length code converting method, the minimum data length m is $m=2$, the minimum code word length n is $n=6$, the code word length number rmax is rmax=4, and the run number of "0" of a binary code word train of continuous code words after conversion is restricted equal to or greater than 5 but equal to or smaller than 16 (d, k). The requirements for such variable length code to be used as a code word include, in addition to three requirements that the (d, k) restriction is satisfied within one code word, that a boundary of a code word can be discriminated correctly and that a code word can be decoded uniformly, an additional requirement that code words are allocated preferentially from that one which includes a greatest number of "1s" so that the average magnetization reversal distance may be minimized.

Similar block coding techniques are disclosed in Japanese Patent Laid-Open Applications Nos. Heisei 01-221920, Heisei 01-221921, Heisei 01-221922, Heisei 01-221923, and Heisei 01-221925, all laid open on Sep. 5, 1989.

The variable length code disclosed in the prior art documents is disadvantageous in that, when compared with the variable length code employed in the present invention, the detecting window width Tw is narrower and the detecting efficiency upon decoding is lower.

Another block coding technique is disclosed in Japanese Patent Laid-Open Application No. Showa 59-160357, laid open on Mar. 3, 1983 under the title of "Coding and Decoding Methods for Binary Data", wherein binary data of 2 bits is converted into a conversion code of 5 bits to enhance, while making the most of a magnetization reversal distance of the HDM-3, the detecting window width to 0.4 T to allow recording and reproduction of data in a high density.

More particularly, according to the block coding technique, binary data are outputted successively in synchronism with a clock signal to terminals for parallel outputs of a serial/parallel register of 10 bits. A coder receives, at input terminals thereof, the data from the output terminals of the serial/parallel register, generates a 5-bit conversion code in accordance with a coding algorithm, and outputs it to 5-bit output terminals. The 5-bit conversion code is inputted to a 5-bit serial/parallel resistor, from which a conversion code train is outputted to an output terminal of it.

The coding method, however, does not involve a variable length code but involves a fixed length code, and employs a code resembling the variable length code employed in the present invention. However, the algorithm of the generating method of the code is complicated, and accordingly, also the hardware configuration is complicated.

A further block coding technique is disclosed in "Proposal of (3, 19;4, 9;3) Code" Collection of Theses of Spring National Conference of Electronic Information Communication Society, 1989, which describes a (3, 19;4, 9;3) code as a concrete example of a (3, k) variable length code. The code is superior in minimum magnetization reversal distance Tmin to the (2, 7) RLL code and the ⅔ code and is superior in Tmin×Tw (minimum magnetization reversal distance × detecting window width) to the (2, 7) RLL code. It is to be noted that characteristic evaluation of the case wherein the code is estimated to be used for a magneto-optic system is disclosed in Television Society Bulletin, Vol. 44, No. 10, pp.1369-1375, 1990.

The conventional codes described above have a subject in that the value of the minimum run number d is low ($d=2$) and the minimum reversal distance Tmin is small. Generally, record media, particularly optical record media, are remarkable in deterioration of a reproduction output in a high frequency band, and in order to achieve high density recording, it is desired to increase the value of d and increase the minimum reversal distance Tmin.

On the other hand, if the value of d is increased, then the value of m is increased and also the value of the binding length r is increased. As a result, the conventional codes have another subject in that a conversion table with which digital data is to be converted into a variable length code is increased in size.

Further, in the case of a variable length code, since a conversion code is different among recording data, it may be exceed the length of a block. In this situation, when it is tried to demodulate a code completely within a block, unless some measure is applied to a modulation code, the conversion code exceeding the length of a block may make a cause of failure in decoding or a cause of an error in result of demodulation. Further, when demodulation is performed across two blocks, if it is tried to begin demodulation with an intermediate portion of a block, failure in demodulation may take place since there is no code of a preceding block.

SUMMARY OF THE INVENTION

It is an object of the present invention to provide a variable length code (d, k;m, n;r) which can provide a greater minimum reversal distance Tmin to allow recording of a higher density than ever.

It is another object of the present invention to provide a modulating method and a demodulating method which prevent the binding length r from becoming long to prevent a conversion table from being increased in size and increase the minimum length d over which the same symbol appears consecutively to increase the minimum reversal distance.

It is a further object of the present invention to provide a modulating apparatus and a demodulating apparatus wherein modulation and demodulation of a variable length modulation code can be completed with necessary and minimum redundancy without a drop of information within a block of a fixed length.

In order to attain the objects described above, according to one aspect of the present invention, there is provided a modulating method for modulating digital data of a basic data length of m bits into a variable length code (d, k;m, n;r) of a basic code length of n bits, wherein, where the distance between adjacent ones of the digital data is represented by T, the minimum reversal distance Tmin of the variable length code is equal to or greater than 2.0 T and the minimum length d of a run of a same symbol is equal to or greater than 4.

According to another aspect of the present invention, there is provided a modulating method for modulating digital data of a basic data length of m bits into a variable length code (d, k;m, n;r) of a basic code length of n bits, wherein, each time the basic data length m of the digital data varies by a predetermined number of bits, the basic code length n of the variable length code is varied at least n1 bits or n2 bits in accordance with at least two different predetermined conversion tables, n1 being different from n2.

According to a further aspect of the present invention, there is provided a modulating apparatus for modulating digital data of a basic data length of m bits into a variable length code (d, k;m, n;r) of a basic code length of n bits, which comprises first converting means for inputting the digital data and converting the input digital data into a first code train in accordance with a first conversion table, second converting means for inputting the digital data and converting the input digital data into a second code train in accordance with a second conversion table, multiplexing means for receiving the first code train from the first converting means and the second code train from the second converting means, and timing managing means for inputting the digital data, detecting a boundary of a block of the input digital data based on a synchronizing signal, and sending out, when a boundary of a block is detected, a control signal to the multiplexing means so that the output of the multiplexing means is changed over from the first code train from the first converting means to the second code train from the second converting means.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 1 is a list showing basic codes used in a modulating method of the present invention;

FIG. 2 is a list showing effective code numbers obtained using the basic codes of FIG. 1;

FIG. 3 is a list showing tables for use for conversion of digital data into a code word using the basic codes of FIG. 1;

FIG. 4 is a list showing numbers of code words obtained when the binding length is varied;

FIG. 5 is a list illustrating comparison of various parameters including a minimum reversal distance Tmin and a maximum reversal distance Tmax among various modulating methods;

FIG. 10 is a list showing basic codes for use for 2-4 conversion;

FIG. 11 is a similar view but showing basic codes for use for 2-5 conversion;

FIG. 12 is a list showing effective code numbers when a code word begins with a basic code of 2-4 conversion;

FIG. 13 is a similar view but showing effective code numbers when a code word begins with a basic code of 2-5 conversion;

FIG. 14 is a list showing tables for use when a code word begins with a basic code (2-4) shown in FIG. 12;

FIG. 15 is a similar view but showing tables for use when a code word begins with a basic code (2-5) shown in FIG. 13;

FIG. 16 is a list showing various parameters including a minimum reversal distance Tmin and a maximum reversal distance Tmax of code words shown in FIGS. 14 and 15;

FIGS. 18a–18f are a timing chart illustrating operation of the modulating apparatus;

FIG. 19 is a block diagram of another demodulating apparatus to which the present invention is applied;

DESCRIPTION OF THE PREFERRED EMBODIMENTS

Figure 6:
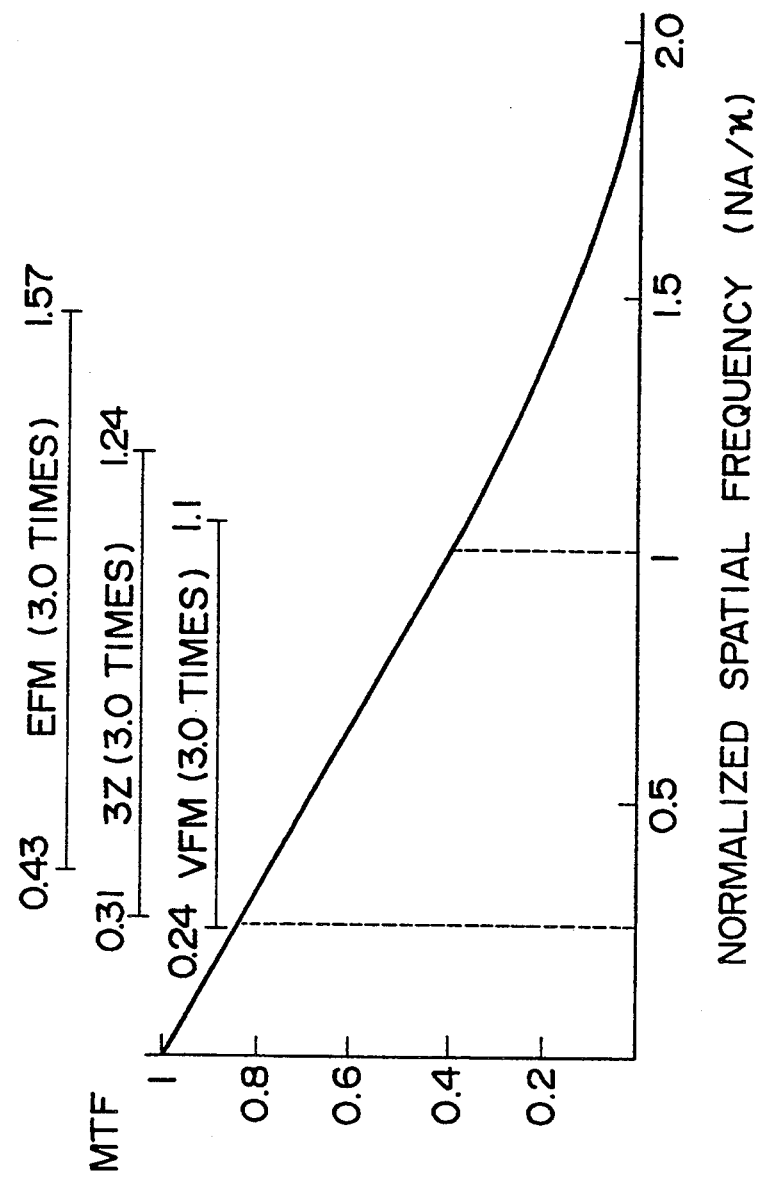
FIG. 6 is a diagram illustrating comparison between the modulating method of the present invention and a conventional modulating method.

Modulation and demodulation of a variable length code (4, 22;2, 5;5) to which the present invention is applied will first be described.

In the modulating method of the present embodiment, a data word having a basic data length of 2 bits is converted into a code word having a basic code length of 5 bits. A total of six basic codes are used as such basic codes. In other words, digital data is converted into a code word of a variable length by combining the six basic codes.

FIG. 2 shows numbers of effective codes obtained using the basic codes. In particular, as the binding length r is successively increased like 1, 2, 3, 4 and 5, the number N of necessary code words varies like 4, 8, 16, 28 and 32. Meanwhile, the number M of code words which can be adopted actually varies like 2, 4, 9, 20 and 34. Accordingly, the difference D between the numbers N and M, that is, N - M, varies like 2, 4, 7, 8 and −2. Consequently, by using code words until the binding length r increases to 5, original digital data can be converted into code words in proper quantities.

FIG. 3 shows a table for conversion of digital data into a code word using the basic codes shown in FIG. 1. As seen from FIG. 3, digital data of a basic data length of 2 bits is converted into a code word of a basic code length of 5 bits. For example, data "11" is converted into a code "00000", and data "10" is converted into another code "10000". Similarly, data of 4, 6, 8 and 10 bit lengths are converted into code words having 10, 15, 20 and 25 code lengths, respectively.

As seen from FIG. 3, when digital data is "11", a code word is "00000". Accordingly, when no specific rule is provided, if the logic 1 (symbol) appears consecutively in digital data, then the logic 0 appears consecutively in a code word. In this instance, a code word is (4, ∞;2, 5;5), and the number of code words obtained when the binding length r is varied varies as shown in FIG. 4. If the logic 0 consecutively appears infinitely, it is difficult to detect self clocks. Therefore, in the modulating and demodulating methods in the present embodiment, when the logic 1 consecutively appears by 6 bits in digital data, the data is converted into the code "000010000100000".

The minimum reversal distance Tmin ($=(m/n)(d+1)T$), the maximum reversal distance Tmax ($=(m/n)(k+1)T$), the data detection window width Tw ($=(m/n)T$), the product of Tmin and Tw and the ratio between Tmax and Tmin of the code words shown in FIG. 3 are such as shown in the column VFM of the table shown in FIG. 5. Here, T is a distance between adjacent digital data. In FIG. 5, also those values when the value of the minimum number number d is 3 (3Z) and of the case of the EFM are shown. As apparent from comparison among the values, in the modulating and demodulating methods of the present embodiment, the minimum reversal distance Tmin is 2.0 T, which is greater than those of the 3Z and the EFM.

FIG. 6 illustrates a relationship between the MTF and the normalized spatial frequency (NA/λ). As shown in FIG. 6, as the normalized spatial frequency increases (as the frequency becomes higher), the MTF decreases. In FIG. 6, also ranges of the normalized spatial frequency when codes are recorded in a same density in accordance with the EFM, 3Z and VFM systems. In the case of the EFM, the normalized spatial frequency ranges from 0.43 to 1.57, but in the case of the VFM, the normalized spatial frequency ranges from 0.24 to 1.1. Accordingly, in order to realize an equal recording density, a lower frequency can be used for the VFM than the EFM. In other words, recording in a higher density is possible. It is to be noted that the magnifications (3.0 times) shown in parentheses in FIG. 6 represent magnifications with respect to the linear density of an ordinary CD (compact disk).

Figure 7:
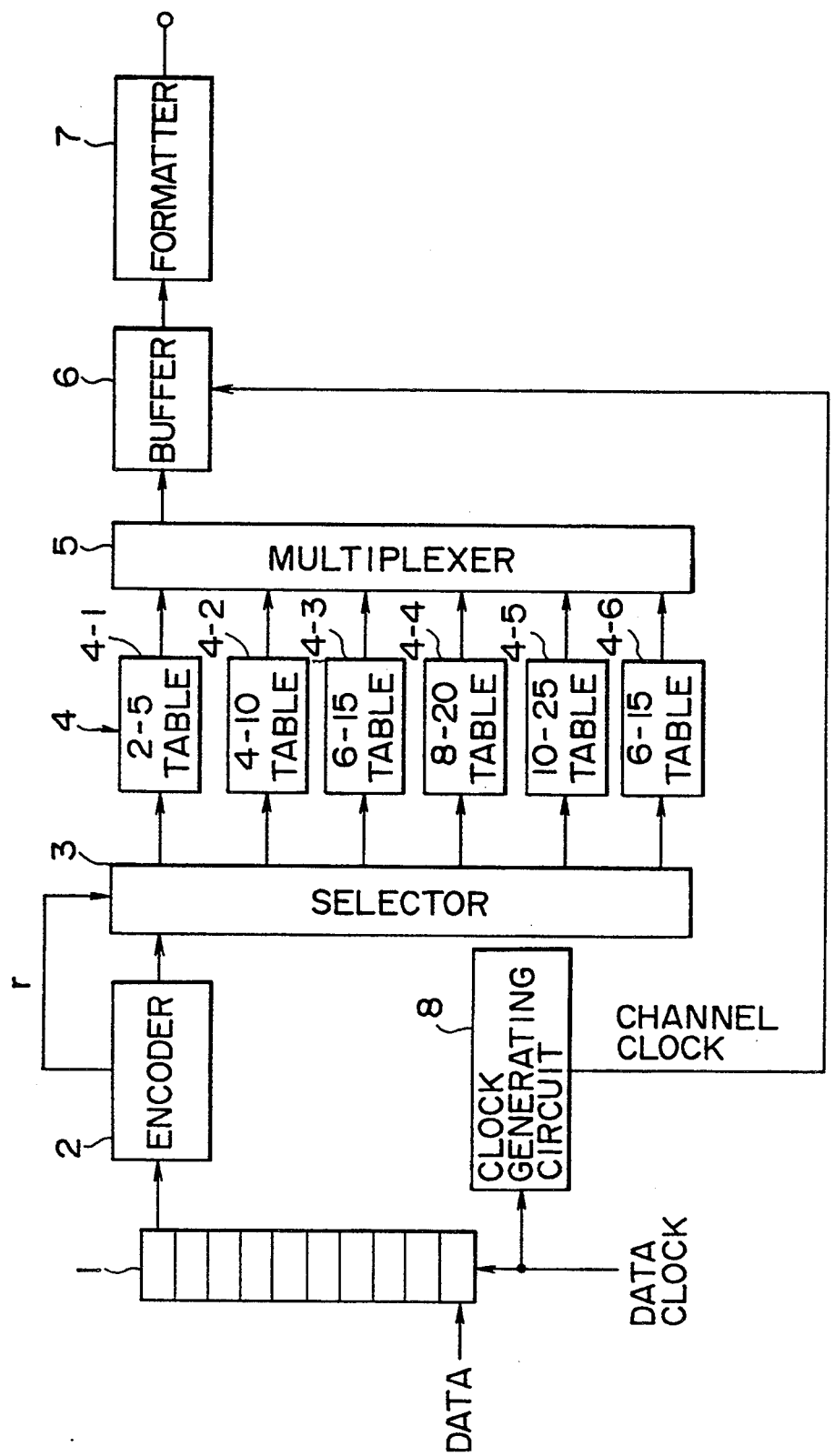
FIG. 7 is a block diagram of a coding apparatus to which the present invention is applied.

FIG. 7 shows a coding apparatus to which the present invention is applied. The coding apparatus shown includes a shift register 1 to which digital data are inputted successively in synchronism with a data clock signal. In the present embodiment, digital data of 10 bits is stored into the shift register 1. Data outputted from the shift register 1 is supplied to an encoder 2, by which the binding length r is discriminated. The encoder 2 outputs the data supplied thereto from the shift register 1 to a selector 3.

The selector 3 supplies digital data supplied thereto from the shift register 1 by way of the encoder 2 to a selected one of ROMS 4-1 to 4-6 in accordance with a result of discrimination of the binding length r outputted from the encoder 2. A table for conversion of data of 2 bits into a code of 5 bits shown in the list of FIG. 3 is stored in advance in the ROM 4-1. Similarly, tables for conversion of digital data of 4, 6, 8 and 10 bit lengths into code words of 10, 15, 20 and 25 code lengths are stored in advance in the ROMs 4-2 to 4-5, respectively. Further, a conversion table for conversion when the logic consecutively appears by 6 bits in input digital data is stored in advance in the ROM 4-6.

A multiplexer 5 composes the outputs of the ROMs 4-1 to 4-6 and outputs the thus composed signal to a buffer 6. Data read out from the buffer 6 is supplied to a formatter 7. A clock generating circuit 8 generates a channel clock signal synchronized with the data clock signal and supplies the channel clock signal to the buffer 6.

In operation, the encoder 2 receives data of 10 bits stored in the shift register 1 and discriminates the binding length r of the received data. Then, the encoder 2 controls the selector 3 in accordance with a result of discrimination thereof so that the input digital data is supplied to a selected one of the ROMs 4-1 to 4-6. When the binding length r is discriminated to be 1, the data of 2 bits is supplied to the ROM 4-1. The data then is either "11" or "10". The digital data "11" is converted into a code "00000" in accordance with the table stored in the ROM 4-1, and the digital data "10" is converted into another code "10000".

On the other hand, when the input digital data is, for example, "0111" the binding length 4 of it is discriminated to be 2, and the data is supplied to the ROM 4-2. Then, the digital data is converted into a code "0100000000" in accordance with the table stored in the ROM 4-2.

The other digital data shown in FIG. 3 are converted into corresponding codes in a similar manner.

Figure 8:
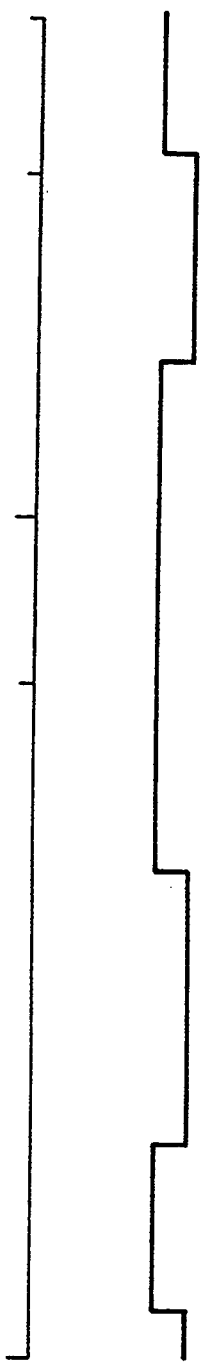
FIGS. 8a–8f are a timing chart illustrating operation of the coding apparatus of FIG. 7.

FIG. 8 shows an example of such conversion. Now, if it is assumed that the input digital data is 18D2 ((a) in FIG. 8) in hexadecimal notation, the binary data ((b) in FIG. 8) is "0001100011010010". The encoder 2 discriminates the binding length r of the inputted binary data in the following manner. In this instance, data corresponding to the first 2 bits "00" does not exist. Thus, it is discriminated whether or not data "0001" of a total of 4 bits obtained by addition to the first 2 bits of the succeeding 2 bits exists in the table. Also the data does not exist in the table as can be seen from FIG. 3.

Thus, adding data of further 2 bits, it is discriminated whether or not data "000110" of 6 bits exists in the table. Since the data does not exist in the table shown in FIG. 3 either, data of further 2 bits is added. The data "00011000" of 8 bits exists in the table at the binding length r=4 in FIG. 3. Therefore, the binding length r is discriminated to be r=4, and the selector 3 supplies the data "00011000" to the ROM 4-4. Then, the digital data is converted into a code word "0100001000000100000" in accordance with the table stored in the ROM 4-4 ((c) in FIG. 8).

The succeeding data "01" of 2 bits does not exist in FIG. 3, and accordingly, data of further 2 bits is added. Since the data "0100" is detected as data at the binding length r=2 in FIG. 3, it is supplied to the ROM 4-2. Then, the data is converted into a code word "0000100000" ((c) in FIG. 8).

The following data "10" is supplied to the ROM 4-1 since the binding length r thereof is detected to be r=1, and the data is converted into a code word "10000" ((c) in FIG. 8).

The code words converted by the ROMs 4-1 to 4-6 in this manner are supplied to the multiplexer 5, by which they are composed into a consecutive code. As described hereinabove, a boundary of the code words exists at the first 20 bits, the next 5 bits, the succeeding 10 bits and the last 5 bits ((d) of FIG. 8).

The code word composed by the multiplexer 5 is supplied to and stored into the buffer 6 in synchronism with the channel clock signal ((f) in FIG. 8). Then, the code word is read out from the buffer 6 and supplied to the formatter 7. The formatter 7 interleaves the code word supplied thereto from the buffer 6 and adds an error correction code and/or a synchronizing signal to the interleaved code word to produce a code of a predetermined format. Then, the code is outputted to a recording circuit not shown. Consequently, a recording signal ((e) in FIG. 8) wherein the level reverses each time the logic 1 appears is produced. The recording signal is recorded onto a record medium such as a magnetic disk or a magneto-optical disk.

Figure 9:
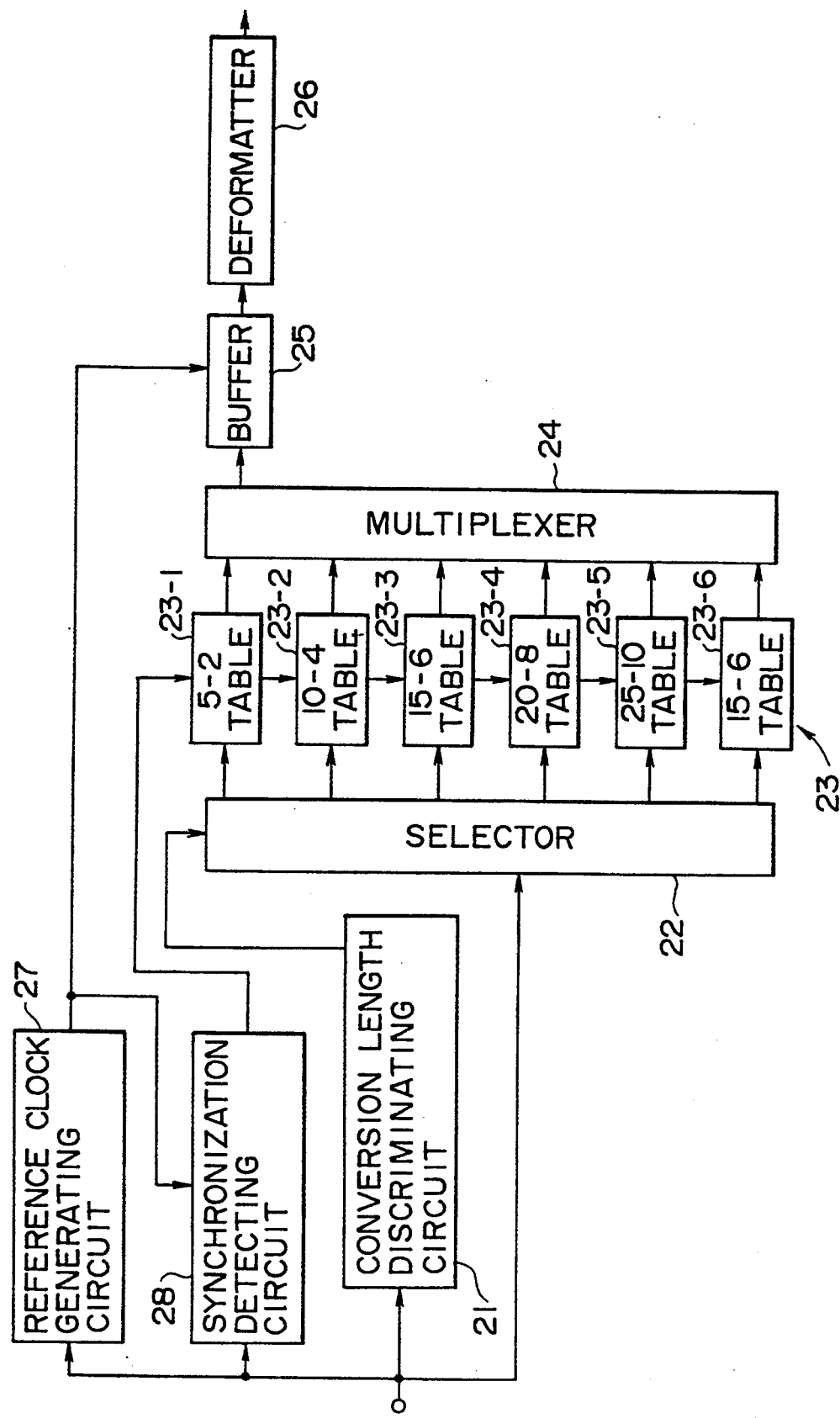
FIG. 9 is a block diagram of a demodulating apparatus to which the present invention is applied.

FIG. 9 shows a demodulating apparatus to which the present invention is applied. A code word reproduced from a record medium is supplied to a selector 22. A conversion length discriminating circuit 21 discriminates a conversion length of the code word and controls the selector 22. The selector 22 supplies the input code word to a selected one of ROMs 23-1 to 23-6 constituting a ROM 23 in accordance with the output of the conversion length discriminating circuit 21. Tables reverse to those shown in FIG. 3 are stored in the ROMs 23-1 to 23-6. In particular, conversion tables for decoding code words shown in FIG. 3 into original digital data are stored in the ROMs 23-1 to 23-6.

A multiplexer 24 composes data read out from the ROMs 23-1 to 23-6 and outputs the thus composed data to a buffer 25. Data read out from the buffer 25 is supplied to a deformatter 26, by which it is deformatted, and the thus deformatted data is supplied to a circuit not shown.

A reference clock generating circuit 27 generates a reference clock signal synchronized with a code word inputted thereto and outputs it to the buffer 25 and a synchronization detecting circuit 28. The synchronization detecting circuit 28 detects the position of a synchronizing signal of a code word with reference to the reference clock signal supplied thereto from the reference clock generating circuit 27. A signal representative of the thus detected position is supplied to the ROM 23.

In operation, the conversion length discriminating circuit 21 discriminates a conversion length of a code word inputted thereto and controls the selector 22 in accordance with a result of the discrimination. Consequently, a code word having a reference code length of 5 bits is supplied to the ROM 23-1, but another code word having a reference code length of 10 bits is supplied to the ROM 23-2. Similarly, a code word having a basic code length of 15 bits, 20 bits or 25 bits is supplied to the ROM 23-3 to 23-5, respectively. Further, when the input code word is "000010000100000" having a code length of 15 bits, it is supplied to the ROM 23-6.

The ROMs 23-1 to 23-6 decode code words inputted thereto into original digital data in accordance with the respective tables stored therein. The digital data decoded by the ROMs 23-1 to 23-6 are composed by the multiplexer 24 and written into the buffer 25. Then, data read out from the buffer 25 is supplied to the deformatter 26, by which such processing as error correction, de-interleave and separation of a synchronizing signal is applied to the data, and the thus processed signal from the deformatter 26 is supplied to the circuit not shown.

As described so far, according to the modulating method of the present embodiment, since the minimum reversal distance of a variable code length is equal to or greater than 2.0 T and the minimum length of a run of a same symbol is equal to or greater than 4, recording of a higher density is permitted comparing with any other conventional modulating method.

Further, according to the modulating apparatus of the present embodiment, since a variable length code wherein the minimum reversal distance is equal to or greater than 2.0 T and the minimum length of a run of a same symbol is equal to or greater than 4 is stored in a plurality of tables and one of the tables is selected in accordance with the binding length of digital data, a code which allows high density recording can be obtained rapidly with a simple construction.

Further, according to the demodulating apparatus of the present embodiment, since a plurality of tables for conversion into digital data of a variable length code wherein the minimum reversal distance is equal to or greater than 2.0 T and the minimum length of a run of a same symbol is equal to or greater than 4 are stored and one of the tables is selected in accordance with a conversion length of a variable length code, data recorded in a high density can be decoded rapidly with a simple construction.

Modulation and demodulation of another variable length code to which the present invention is applied will be described subsequently.

In the modulating method, a data word having a basic data length of 2 bits is converted into a code word having a basic code length of 4 bits or 5 bits. Five basic codes (2-4) listed in FIG. 10 and seven basic codes (2-5) listed in FIG. 11 are used as such basic codes. In other words, digital data is converted into a code word of a variable length by combining the basic codes (2-4) and the basic codes (2-5) in an alternate relationship.

In the modulating method of the present embodiment, different conversion tables (and accordingly, different code words) are used for a code word whether the code word begins with a basic code (2-4) or another basic code (2-5). FIGS. 12 and 13 show numbers of effective codes obtained when a code word begins with a code word (2-4) and when a code word begins with another code word (2-5), respectively. In particular, when a code word begins with a basic code (2-4), as the binding length r is successively increased like 1, 2, 3 and 4 as shown in FIG. 12, the number N of necessary code words varies like 4, 8, 12 and 12. Meanwhile, the number M of code words which can be adopted actually varies like 2, 5, 9 and 18. Accordingly, the difference D between the numbers N and M, that is, N - M, varies like 2, 3, 3 and −6. Consequently, by using code words until the binding length r increases to 4, original digital data can be converted into code words in proper quantities.

Similarly, when a code word begins with another basic code (2-5), as the binding length r is successively increased like 1, 2, 3 and 4 as shown in FIG. 13, the number N of necessary code words varies like 4, 8, 12 and 16. Meanwhile, the number M of code words which can be adopted actually varies like 2, 5, 8 and 17. Accordingly, the difference D between the numbers N and M varies like 2, 3, 4 and −1. Consequently, by using code words until the binding length r increases to 4, original digital data can be converted into code words in proper quantities.

Figure 14:
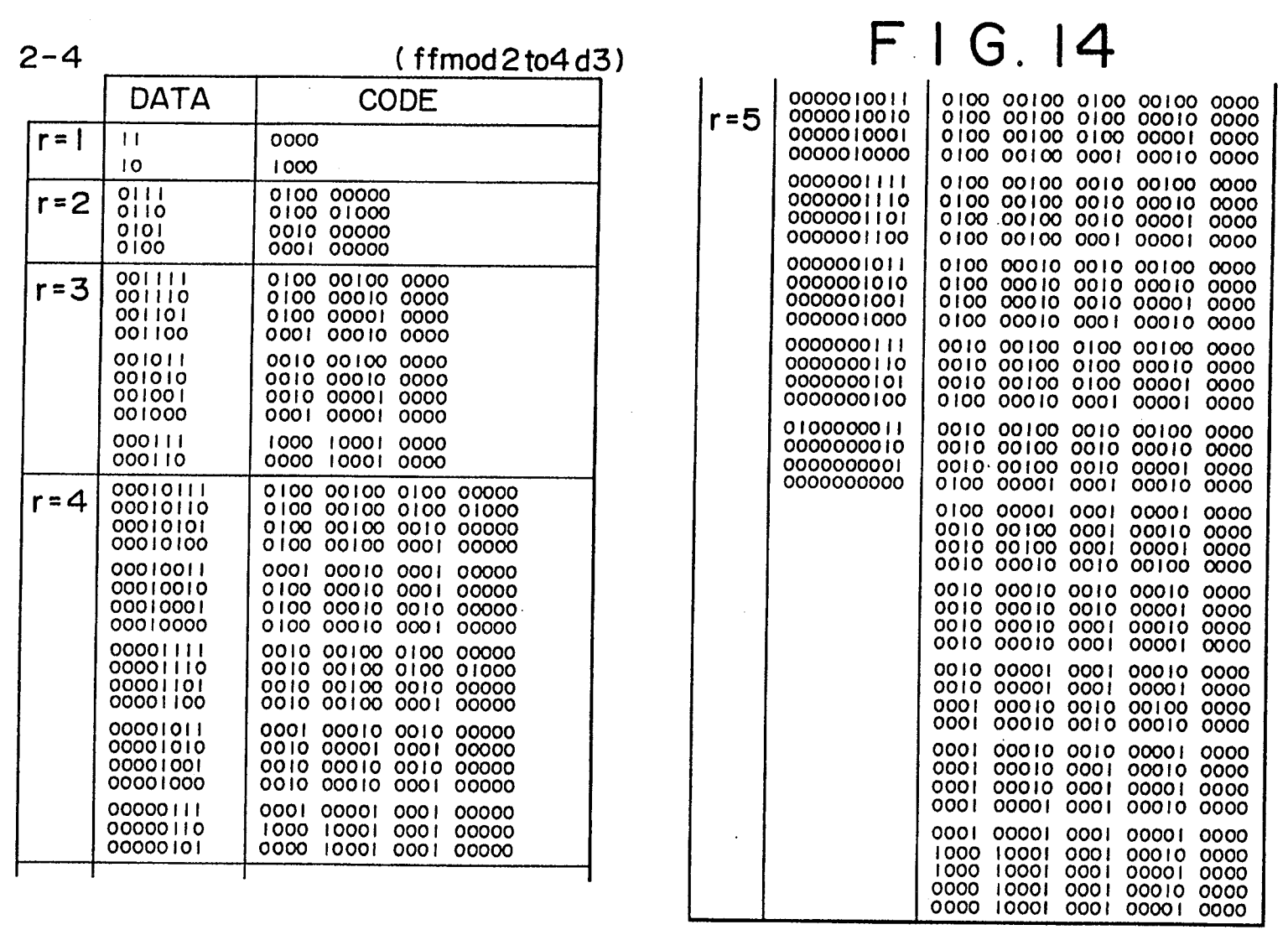

FIGS. 14 and 15 show tables for conversion of digital data into a code word using the basic codes shown in FIGS. 10 and 11. FIG. 14 shows tables wherein code words begin with the basic codes (2-4) shown in FIG. 10 while FIG. 15 shows tables wherein code words begin with the basic codes (2-5) shown in FIG. 11. As apparently seen from FIGS. 14 and 15, any digital data is converted into a code word formed from a selective alternate combination of the basic codes shown in FIGS. 10 and 11.

In particular, with regard to the code words listed in FIG. 14, since any of them begins with one of the basic codes (2-4) shown in FIG. 10, every time the binding length r increases by one so that digital data increases by 2 bits, one of the basic codes (2-5) shown in FIG. 11 and one of the basic codes (2-4) shown in FIG. 10 are added successively and alternately to construct a code word. On the other hand, with regard to the code words listed in FIG. 15, since any of them begins with one of the basic codes (2-4) shown in FIG. 11, every time the binding length r increases by one so that digital data increases by 2 bits, one of the basic codes (2-4) shown in FIG. 10 and one of the basic codes (2-5) shown in FIG. 11 are added successively and alternately to construct a code word.

As seen from the tables, the variable length codes in the present embodiment substantially constitute a (3, 15;4, 9;4) code system. However, since the conversion ratio (m/n) can be represented, when represented in the form of (d, k;m, n;r), as (d, k;(m,n)/(m',n');r), that is (3, 15;(2,4)/(2,5);4) since it varies each time the digital data increases by 2 bits. Since the conversion ratio varies in this manner, even if the value is set to 3 and is thus increased from the conventional value of d=2, the binding length r is prevented from becoming too great and the conversion tables are prevented from becoming excessively great.

The minimum reversal distance Tmin $(=(m/n)(d+1)T)$, the maximum reversal distance Tmax $(=(m/n)(k+1)T)$, the data detection window width Tw $(=(m/n)T)$ and the ratio between Tmax and Tmin of the code words shown in FIGS. 14 and 15 are 1.78 T, 7.1 T, 0.44 T and 4, respectively, as shown in FIG. 16.

Figure 17:
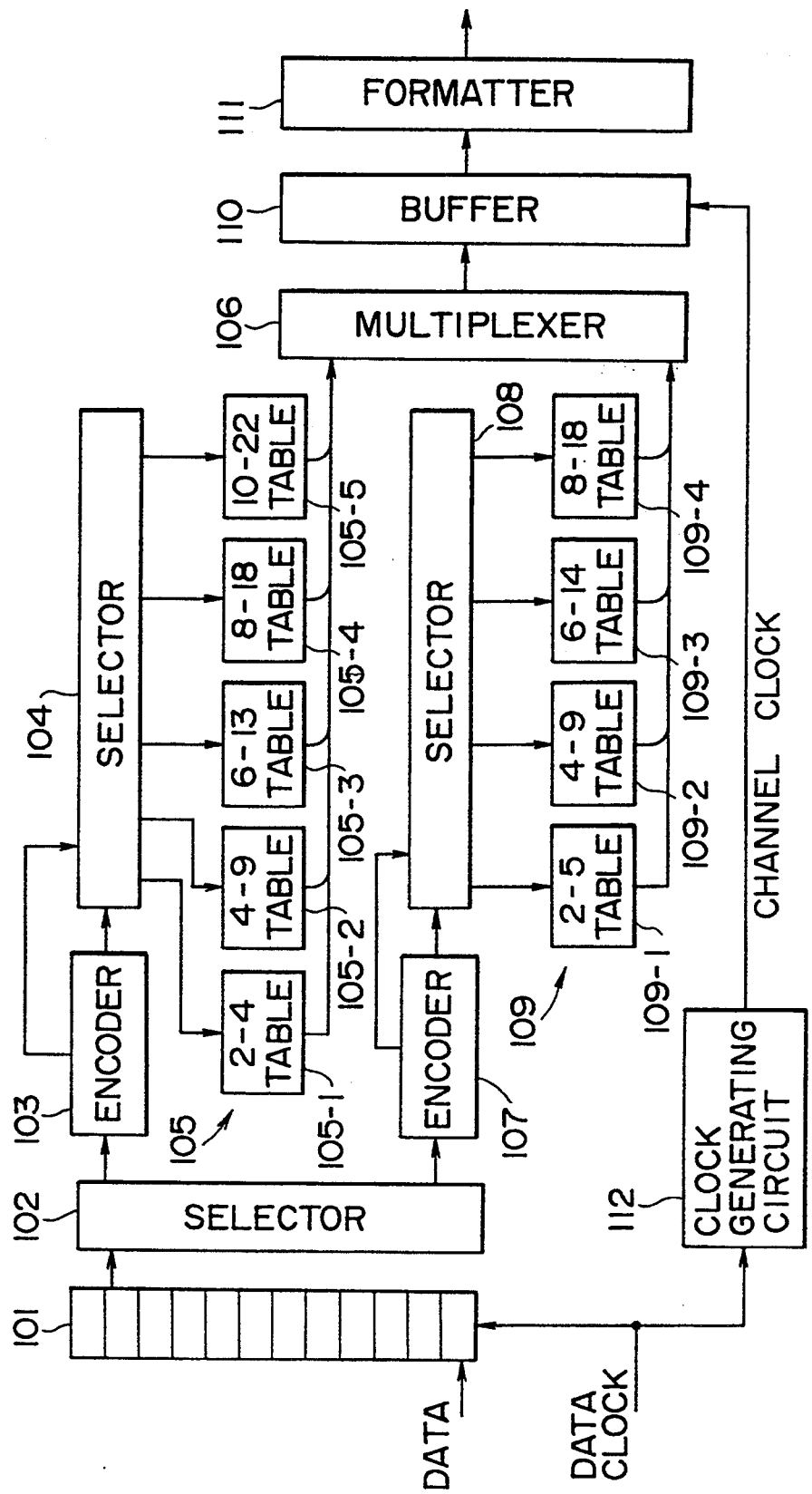
FIG. 17 is a block diagram of a modulating apparatus to which the present invention is applied.

FIG. 17 shows a modulating apparatus to which the present invention is applied. The modulating apparatus shown includes a shift register 101 to which digital data are inputted successively in synchronism with a data clock signal. In the present embodiment, digital data of 10 bits is stored into the shift register 101. Data outputted from the shift register 101 is supplied to a selector 102. The selector 102 separates the digital data in units of 2 bits and discriminates whether the first unit of the data of an object for processing is an odd-numbered unit or an even-numbered unit. When the first unit of the data of an object for processing is an odd-numbered unit, the data is supplied to an encoder 103, but when the first unit is an even-numbered data, the data is supplied to another encoder 107. The encoder 103 or 107 discriminates the binding length r of the input digital data. The encoder 103 or 107 outputs the digital data supplied thereto from the shift register 101 to a selector 104 or 108, respectively.

The selector 104 supplies digital data supplied thereto from the shift register 101 by way of the selector 102 and the encoder 103 to a selected one of ROMS 105-1 to 105-5 in accordance with a result of the discrimination of the binding length r outputted from the encoder 103. A table for conversion of data of 2 bits into a code of 4 bits shown in FIG. 14 is stored in the ROM 105-1. Similarly, tables for conversion of digital data of 4, 6, 8 and 10 bit lengths into code words of 9, 13, 18 and 22 code lengths are stored in the ROMs 105-2 to 105-5, respectively.

Similarly, the selector 108 supplies digital data supplied thereto from the shift register 101 by way of the selector 102 and the encoder 107 to a selected one of ROMS 109-1 to 109-4 in accordance with a result of the discrimination of the binding length r outputted from the encoder 107. A table for conversion of data of 2 bits into a code of 5 bits shown in FIG. 15 is stored in the ROM 109-1. Similarly, tables for conversion of digital data of 4, 6 and 8 bit lengths into code words of 9, 14 and 18 code lengths are stored in the ROMs 109-2 to 109-4, respectively.

A multiplexer 106 composes the outputs of the ROMs 105-1 to 105-5 and the outputs of the ROMs 109-1 to 109-4 and outputs the thus composed signal to a buffer 110. Data read out from the buffer 110 is supplied to a formatter 111. A clock generating circuit 112 generates a channel clock signal synchronized with the data clock signal and supplies the channel clock signal to the buffer 110.

In operation, the selector 102 outputs data stored in the shift register 101, for example, to the encoder 103 since the first unit of the digital data which is a first object for processing is an odd-numbered unit (first unit). The encoder 103 receives the data of 10 bits to the maximum stored in the shift register 101 and successively discriminates the binding, length r of the received data in order from the beginning. Then, the encoder 103 controls the selector 104 in accordance with a result of the discrimination so that the input digital data is supplied to a selected one of the ROMs 105-1 to 105-5. When the binding length r is discriminated to be 1, the object for processing is the data of 2 bits, and the data is supplied to the ROM 105-1. In this instance, the data is either "11" or "10" as seen from FIG. 14. The digital data "11" is converted into a code "0000" in accordance with the table stored in the ROM 105-1, and the digital data "10" is converted into another code "1000".

When processing of digital data of the binding length r is completed, the selector 102 discriminates the orderly number of the first unit of data which is an object for next processing and outputs the data to the encoder 103 if the orderly number is an odd number, but outputs the data to the other encoder 107 if the orderly number is an even number.

The selector 102 is changed over to the encoder 103 side or the encoder 107 side so that digital data is converted into a variable length code making use of the tables stored in the ROM 105 and the ROM 109 in such a manner as described above.

FIG. 18 shows an example of such conversion. Now, if it is assumed that the input digital data is 18D2 ((a) in FIG. 18) in hexadecimal notation, the binary data ((b) in FIG. 18) is "0001100011010010". The encoder 103 discriminates the binding length r of the inputted binary data in the following manner. Data corresponding to the first 2 bits "00" does not exist in the list of FIG. 14. Thus, it is subsequently discriminated whether or not data "0001" of a total of 4 bits (2 units) obtained by addition to the first 2 bits of the succeeding 2 bits (one unit) exists in the conversion tables of the list of FIG. 14. The data does not exist in the conversion tables either as can be seen from FIG. 14.

Thus, adding data of further 2 bits (one unit), it is discriminated whether or not data "000110" of 6 bits (3 units) exists in the conversion tables. Since the data exists in the conversion table for the binding length r=0 in the list shown in FIG. 14, the binding length r is discriminated to be r=3, and the selector 103 supplies the data "000110" to the ROM 105-3. Then, the digital data is converted into a code word "0000100010000" in accordance with the conversion table stored in the ROM 105-3 ((c) in FIG. 18).

The succeeding-data "00" of 2 bits is a fourth (even-numbered) unit, and accordingly, the data is supplied to the encoder 107. Since the data "00" does not exist in the list shown in FIG. 15, data of further 2 bits (one unit) is added, and presence or absence of the data "0100" in the list shown in FIG. 15 is discriminated. Since the data is discriminated as data of the binding length r=2 in FIG. 15, it is supplied to the ROM 4-2, by which it is subsequently converted into a code word "001000000" ((c) in FIG. 18).

The following data "01" of 2 bits is also processed by the encoder 107 since it is a sixth (even-numbered) unit. Since the binding length r of the data "01" is detected to be r=1 in FIG. 15, it is supplied to the ROM 109-1, by which it is converted into a code word "01000" ((c) in FIG. 18).

The code words converted by the ROMs 105-1 to 105-5 and the ROMs 109-1 to 109-4 in this manner are supplied to the multiplexer 106, by which they are composed into a consecutive code in which one of the basic codes (2-4) and one of the basic codes (2-5) are disposed alternately. As described hereinabove, a boundary of the code words exists at the first 13 bits, the next 9 bits and the last 5 bits ((d) of FIG. 18).

The code word composed by the multiplexer 106 is supplied to and stored into the buffer 110 in synchronism with the channel clock signal ((f) in FIG. 18). Then, the code word is read out from the buffer 110 and supplied to the formatter 111. The formatter 111 interleaves the code word supplied thereto from the buffer 110 and adds an error correction code and/or a synchronizing signal to the interleaved code word to produce a code of a predetermined format. Then, the code is outputted to a recording circuit not shown. Consequently, a recording signal ((e) in FIG. 18) wherein the level reverses each time the logic 1 appears is produced. The recording signal is recorded onto an information record medium such as a magnetic disk or a magneto-optical disk.

FIG. 19 shows another demodulating apparatus to which the present invention is applied. A reference clock generating circuit 131 generates a reference clock signal synchronized with a code word reproduced from a record medium and supplied thereto and outputs the reference clock signal to a buffer 129 and a synchronization detecting circuit 132. The synchronization detecting circuit 132 detects the position of a synchronizing signal of a code word with reference to the reference clock signal supplied thereto from the reference clock generating circuit 131. Then, a signal representative of such detection is supplied to a selector 121. The selector 121 supplies, when such detection signal is inputted thereto, a code word inputted thereto first to a conversion length discriminating circuit 122 side, and thereafter, if the first code of each block is a basic code (2-5), a code of the block is supplied to the conversion length discriminating circuit 122 side, but if the first code of each block is a basic code (2-4), a code of the block is supplied to another conversion length discriminating circuit 125 side.

The conversion length discriminating circuit 122 discriminates a conversion length of a code word inputted thereto and controls a selector 123 in accordance with a result of the discrimination. The selector 123 supplies the input code word to one of ROMs 24-1 to 124-5 constituting a ROM 124 in accordance with the output of the conversion length discriminating circuit 122. Tables reverse to those shown in FIG. 14 are stored in the ROMs 124-1 to 124-5. In particular, conversion tables for decoding code words shown in FIG. 14 into original digital data are stored in the ROMs 124-1 to 124-5.

Similarly, the conversion length discriminating circuit 125 discriminates a conversion length of a code word inputted thereto and controls another selector 126. The selector 126 supplies the input code word to a selected one of ROMs 127-1 to 127-4 constituting another ROM 127 in accordance with the output of the conversion length discriminating circuit 125. Tables reverse to those shown in FIG. 15 are stored in the ROMs 127-1 to 127-4. In particular, conversion tables for decoding code words shown in FIG. 15 into original digital data are stored in the ROMs 127-1 to 127-4.

A multiplexer 128 composes data read out from the ROMs 124-1 to 124-5 and the ROMS 127-1 to 127-4 into continuous digital data and outputs the continuous digital data to a buffer 129. Data read out from the buffer 129 is supplied to a deformatter 130, by which it is deformatted, and the thus deformatted data is supplied to a circuit not shown.

In operation, the conversion length discriminating circuit 122 discriminates a conversion length of a code word inputted thereto and controls the selector 123 in accordance with a result of the discrimination. Consequently, a code word having a basic code length of 4 bits is supplied to the ROM 124-1, but another code word having a basic code length of 9 bits is supplied to the ROM 124-2. Similarly, a code word having a basic code length of 13 bits, 18 bits or 22 bits is supplied to the ROM 124-3 to 124-5, respectively.

The ROMs 124-1 to 124-5 and the ROMS 127-1 to 127-4 decode code words inputted thereto into original digital data in accordance with the respective tables stored therein. The digital data demodulated by the ROMs 124-1 to 124-5 and the ROMs 127-1 to 127-4 are composed by the multiplexer 128 and written into the buffer 129. Then, data read out from the buffer 129 is supplied to the deformatter 130, by which such processing as error correction, de-interleave and separation of a synchronizing signal is applied to the data, and the thus processed signal from the deformatter 130 is supplied to the circuit not shown.

As described so far, according to the demodulating method of the present embodiment, since the basic code length n of a variable length code is varied at least by n1 bits or n2 bits in accordance with two different predetermined conversion tables each time the basic data length m of digital data varies by a predetermined bit number, the minimum length of a run of a same symbol can be increased and the minimum reversal distance can be increased while preventing the binding length from increasing and preventing the conversion tables from increasing in size.

Further, according to the modulating apparatus of the present embodiment, since the basic code length n of a variable length code is successively varied by n1 bits or n2 bits in accordance with a first conversion table and a second conversion table each time the basic data length m of digital data varies by a predetermined bit number, a code wherein the minimum length of a run of a same symbol is comparatively great can be obtained rapidly with a simple construction.

Further, according to the demodulating apparatus of the present embodiment, since a code is converted into digital data in accordance with a first conversion table and a second conversion table so that the basic data length m of digital data is successively varied by a predetermined number of bits each time the basic code length n of a variable length code varies by n1 bits or n2 bits, a code wherein the minimum length of a run of a same symbol is comparatively great can be decoded rapidly with a simple construction.

Figure 20:
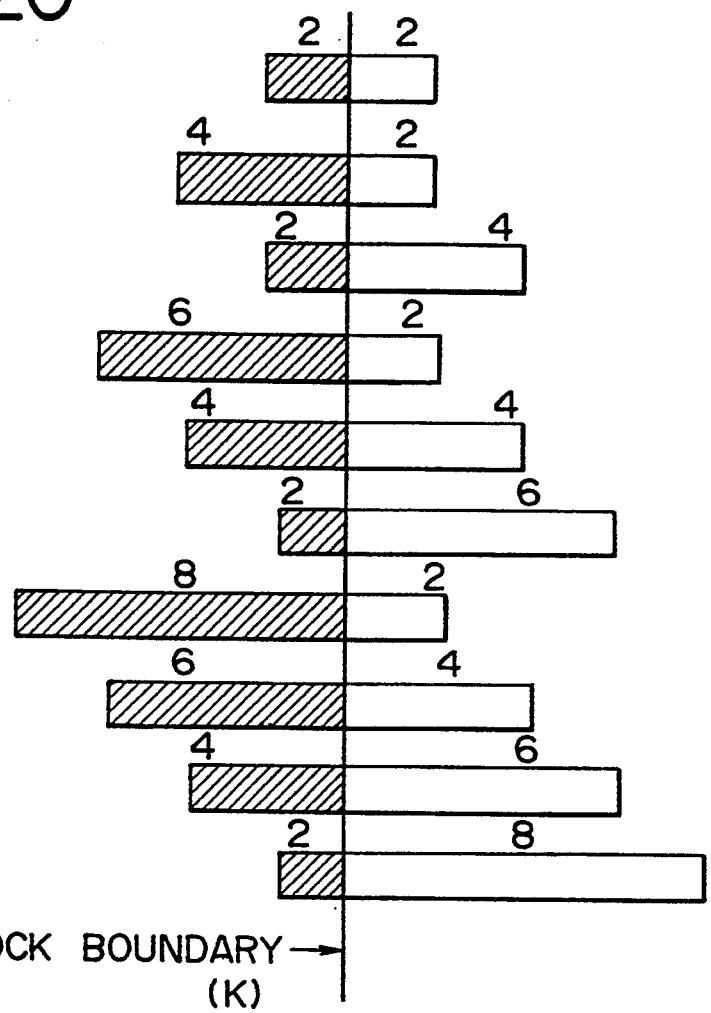
FIG. 20 is a diagrammatic view illustrating a relationship between a conversion input data length and a block length.

By the way, when, for example, a variable length code (4, 22;2, 5;5) is considered as an example, the variable length code involves five kinds of conversion input data lengths of 2, 4, 6, 8 and 10 bits. Further, such 10 cases as shown in FIG. 20 are listed as cases wherein a code protrudes from a block. Referring to FIG. 20, a central vertical line k denotes a boundary between blocks. When it is tried to demodulate a code completely within a block in such a situation, that is, when it is tried to demodulate a code only within a portion of the code indicated by slanting lines in FIG. 20, unless some measure is applied to a modulation code, the conversion code exceeding the length of a block may make a cause of failure in demodulation or a cause of an error in result of demodulation. Further, when demodulation is performed across two blocks, if it is tried to begin demodulation with an intermediate portion of a block, failure in demodulation may take place since there is no code of a preceding block.

Figure 21:
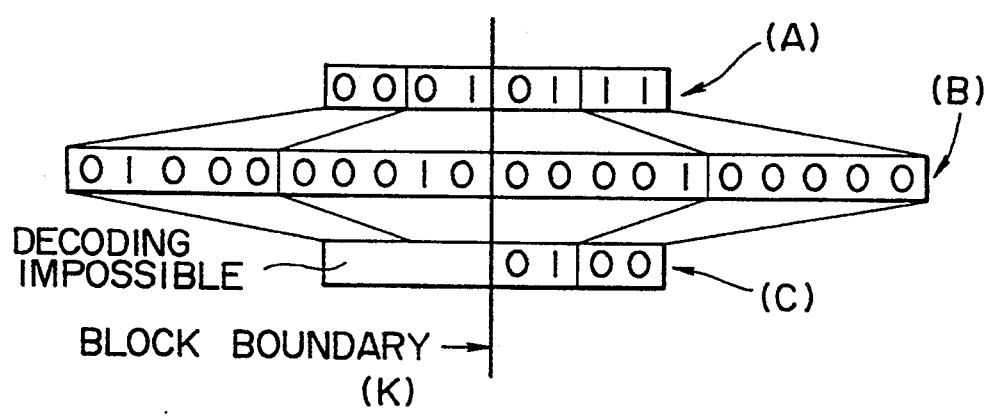
FIG. 21 is a diagram illustrating an example wherein demodulation of data fails or produces an error in demodulating processing.

FIG. 21 shows an example of a case wherein demodulation fails or an error takes place in a result of demodulation described above. In particular, when modulation and demodulation are performed across a block boundary as shown in FIG. 20, first in modulation, recording data shown in (A) of FIG. 20 is converted, in accordance with a code present in the left column in FIG. 3, into another code indicated on the right column. In this instance, in accordance with the list of FIG. 3, recording data "00010111" is converted into a variable length code of "01000000100000100000" as indicated on the right side. This manner can be seen from (B) of FIG. 21. Then, when it is tried to demodulate the variable length code, it is first attempted to demodulate the code "0100000010" in the block in accordance with the list of FIG. 3, but since the code cannot be found in the tables shown in FIG. 3, modulation (decoding) of the code is impossible as seen from (C) of FIG. 21. On the other hand, the code "0000100000" outside the boundary of the block can be demodulated into "0100" in accordance with the tables shown in FIG. 3, but this is a data different from the input data as seen from FIG. 21 and from recording data which is otherwise obtained correctly.

Thus, a coding apparatus and a decoding apparatus wherein modulation and demodulation into and from a variable length modulation code can be completed with necessary and minimum redundancy without a drop of information within a block of a fixed length are provided in accordance with the present invention.

Figure 22:
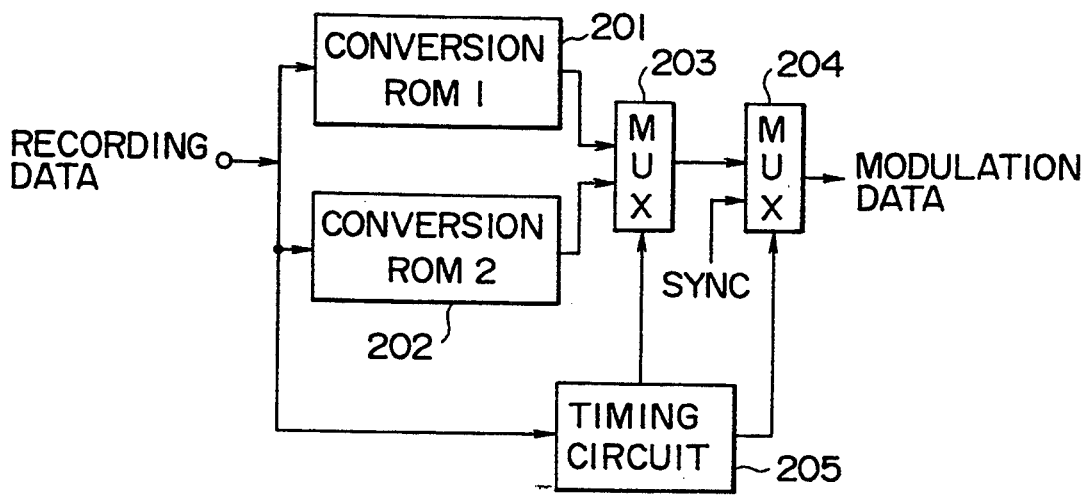
FIG. 22 is a block diagram of another modulating apparatus to which the present invention is applied.

FIG. 22 shows a coding apparatus to which the present invention is applied. In the coding apparatus of the present embodiment, recording data is supplied to a ROM ROM1 serving as first converting means and another ROM ROM2 serving as second converting means, and the recording data are coded in accordance with a table stored in the ROM ROM1 and constituting a first conversion table and another table stored in the ROM ROM2 and constituting a second conversion table 2. Code trains outputted from the ROM ROM1 and the ROM ROM2 are supplied to a multiplexer (MUX) 203 serving as multiplexing means.

An output of the multiplexer 203 is supplied to another multiplexer 204, to which a synchronizing signal (SYNC) is supplied from a circuit not shown. Meanwhile, the recording data mentioned above is supplied also to a timing circuit 205 constituting timing managing means. The timing circuit 205 monitors the recording data to detect a boundary (k) of a block of the recording data. Then, when the timing circuit 205 detects a boundary of a block of the recording data, it outputs a control signal to the multiplexer 203 so that the output of the multiplexer 203 is changed over from a first code train from the ROM ROM1 to a second code train from the ROM ROM2. Further, when the timing circuit 205 detects a boundary of a block of the recording data, the timing circuit 205 outputs a control signal to the multiplexer 204.

Figures 24, 25:
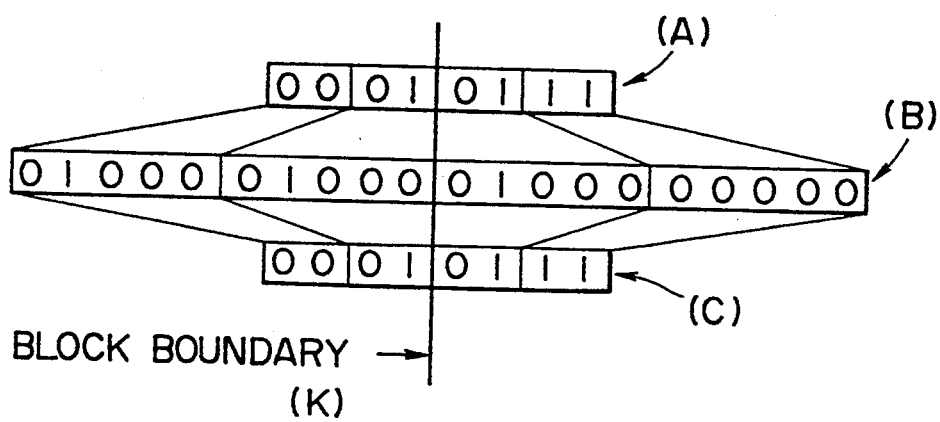
FIG. 24 is a list illustrating contents of tables used in the modulating apparatus and the demodulating apparatus of FIGS. 22 and 23.
FIG. 25 is a diagrammatic view illustrating regular demodulation of data in demodulating processing.

The table 1 shown in FIG. 3 is stored in the ROM ROM1. In particular, the table 1 is used such that the recording data of 2 bits, 4 bits, 6 bits, 8 bits and 10 bits indicated in the left column of FIG. 3 are converted into recording codes of 5 bits, 10 bits, 15 bits, 20 bits and 25 bits indicated in the right column of FIG. 3, respectively. Meanwhile, another table 2 shown in FIG. 24 is stored in the ROM ROM2. The table 2 is used such that recording data of 2 bits, 4 bits, 6 bits and 8 bits indicated in the left column of FIG. 24 are converted into recording codes of 5 bits, 10 bits, 15 bits and 20 bits indicated in the right column of FIG. 24, respectively.

The table 1 shown in FIG. 3 is used to convert recording data which are accommodated within the range of a block as a unit of processing of recording data, but the table 2 shown in FIG. 24 is used to convert recording data which protrude from the range of a block as a unit of processing of recording data.

In the coding apparatus of the construction described above, the timing circuit 205 shown in FIG. 22 monitors recording data supplied thereto and manages timings. Then, if the recording data is accommodated within a block, modulation data converted in accordance with the converting rule of the table 1 stored in the ROM ROM1, that is, coded data, is selected and outputted.

Here, if recording data, for example, data "00010111" is inputted and the timing circuit 205 discriminates that a boundary of the block comes to the fourth bit of the recording data, the timing circuit 205 sends out a control signal to the multiplexer 203. Consequently, the multiplexer 203 selects, for the data of the four bits in the block, that is, for "0001" data "0100001000" converted in accordance with the converting rule of the table 2 stored in the ROM ROM2. On the other hand, the data of "0111" of the remaining 4 bits is converted into a code train of "0100000000" in accordance with the converting rule of the table 1 stored in the ROM ROM1.

Such operation is illustrated in FIG. 25. Referring to FIG. 25, (A) shows the recording data while (B) shows coded data after conversion. Accordingly, the recording data "00010111" which protrudes from the boundary of the block at the fourth bit is converted into the code word of "01000010000100000000" as a result. In this instance, when necessary, a synchronizing signal (SYNC) representative of a delimiter to the block is inserted by way of the multiplexer 204.

Figure 23:
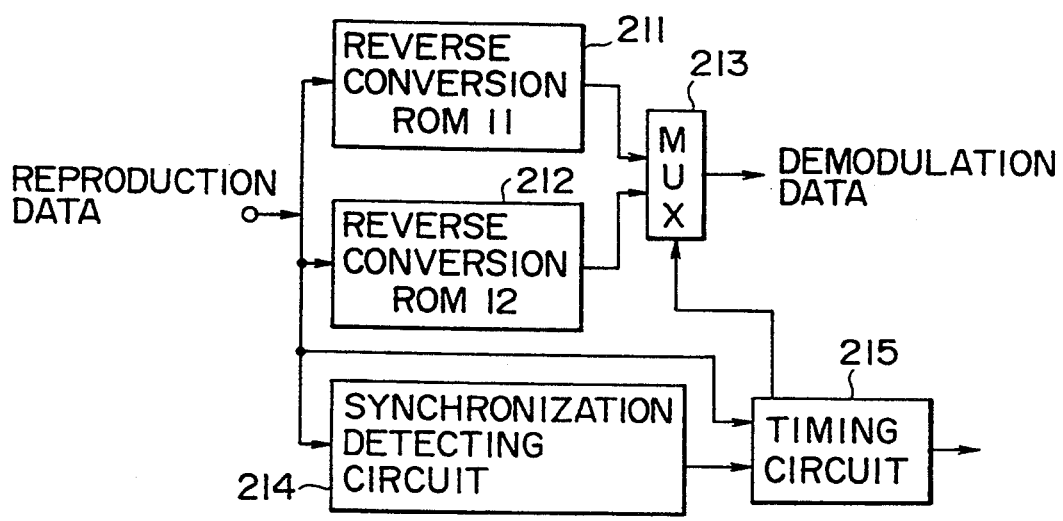
FIG. 23 is a block diagram of a further demodulating apparatus to which the present invention is applied.

Referring now to FIG. 23, there is shown a demodulating apparatus to which the present invention is applied. In the demodulating apparatus of the present embodiment, reproduction data, that is, a variable length code, is supplied to a ROM ROM11 serving as first converting means and another ROM ROM12 serving as second converting means, and the reproduction data is decoded in accordance with the table 1 constituting the first conversion table stored in the ROM ROM11 and the table 2 constituting the second conversion table stored in the ROM ROM12. First and second demodulation data outputted from the ROMs ROM11 and ROM12 are supplied to a multiplexer 213 serving as multiplexing means.

The reproduction data is supplied also to a synchronizing signal detecting circuit 214 and a timing circuit 215 which serves as timing managing means, and the timing circuit 215 monitors an output of the synchronizing signal detecting circuit 214 and the reproduction data. When a particular code word is detected from the reproduction data, the timing circuit 215 sends out a control signal to the multiplexer 213. Upon reception of the control signal, the multiplexer 213 is controlled so that the output thereof is changed over from the second demodulation data from the ROM ROM12 to the first demodulation data from the ROM ROM11. In other words, the second demodulation data from the ROM 12 is outputted from the demodulating apparatus unless the timing circuit 215 detects the particular code word from the reproduction data.

In particular, while the last five characters of all of data obtained by conversion by the ROM ROM1 are "00000" as shown in FIG. 3, the last five characters of data obtained by conversion by the ROM ROM2 are not "00000". Accordingly, by which one of the tables data has been converted can be identified depending upon whether or not the last five characters of the data are "00000".

The ROMs ROM11 and ROM12 are constructed as reverse converting circuits for reverse conversion of the tables stored in the ROMs ROM1 and ROM2, that is, as circuits for converting codes in the right column into codes in the left column of the tables shown in FIGS. 3 and 24, respectively.

The conversion then is illustrated at (B) and (C) in FIG. 25. In particular, reproduction data indicated at (B) in FIG. 25 is detected by the timing circuit 215. The timing circuit 215 thus judges whether or not the last portion of the data ends with the particular code word of "00000" (the last portion of the data can be discriminated since a synchronizing signal follows it). As seen from (B) of FIG. 25, the last reproduction data of the block is "0100001000", and accordingly, the reproduction data is demodulated by the second converting means of the ROM ROM12 so that demodulation data of "0001" is obtained.

The first reproduction data (except a synchronizing signal) of a next block is "0100000000", and in this instance, the timing circuit 215 detects that the data ends with the particular code word of "00000". Accordingly, the reproduction data then is demodulated by the first converting means of the ROM ROM11 so that demodulation data of "0111" is obtained.

As apparent from the foregoing description, according to the modulating apparatus of the present embodiment, when the timing managing means detects a boundary of a block of recording data, it supplies a control signal to the multiplexing means so that the output of the multiplexing means is changed over from a first code train based on the first conversion table to a second code train based on the second conversion table. Accordingly, recording data can be converted into a variable length code with which modulation is completed with necessary and minimum redundancy.

Further, according to the demodulating apparatus of the present embodiment, when the timing managing means detects a particular code word of the variable length code, it supplies a control signal to the multiplexing means so that the output of the multiplexing means is changed over from second demodulation data based on the second conversion table to first modulation data based on the first conversion table.

Accordingly, coded data which does not suffer from a drop of information nor from a demodulation error can be provided.

Having now fully described the invention, it will be apparent to one of ordinary skill in the art that many changes and modifications can be made thereto without departing from the spirit and scope of the invention as set forth herein.

What is claimed is:

1. A method for modulating digital data of a basic data length of m bits into a variable length code (d, k;m, n;r) of a basic code length of n bits, wherein a distance between adjacent ones of the digital data is represented by T, comprising:

discriminating a binding length r of a set of digital data bits contained in a first sequence of digital data bits;

partitioning the first sequence of data bits into a second sequence of data bits having the binding length r, and the remaining data bits in the first sequence of data bits;

repeating the previous steps of the method until the first sequence of data bits is completely partitioned into a set of second sequences of data bits, wherein the sequences in the set may have different binding lengths;

converting each member of the set of second sequences of data bits into a code word, wherein a minimum reversal distance Tmin of the code word is equal to or greater than 2.0 T, and a minimum length d of a run of a same symbol in the code word is equal to or greater than 4; and forming a code word for the first sequence of data bits by combining the code words resulting from converting each of the set of second sequences of data bits into code words.

2. The modulating method of claim 1, wherein a maximum reversal distance Tmax of the variable length code is equal to or smaller than 9.2 T.

3. The modulating method of claim 2, wherein the last 5 bits of a code word of the variable length code are all 0, except when the binding length r of the digital data is 1.

4. The modulating method of claim 3, wherein the basic data length m of the digital data is 2, 4, 6, 8 or 10 bits, while the basic code length n of the variable length code is 5, 10, 15, 20 or 25 bits, respectively.

5. A modulating apparatus for modulating digital data of a basic data length of m bits into a variable length code (d, k;m, n;r) of a basic code length of n bits, comprising:

storage means for storing therein a plurality of tables for converting the digital data into the variable length code wherein, where the distance between adjacent ones of the digital data is represented by T, the minimum reversal distance Tmin is equal to or greater than 2.0 T and the minimum length d of a run of a same symbol is equal to or greater than 4;

discriminating means for discriminating the binding length r of the digital data; and selecting means for selecting one of the tables in said storage means in accordance with a result of discrimination of said discriminating means.

6. A modulating apparatus according to claim 5, wherein the maximum reversal distance Tmax of the variable length code is equal to or smaller than 9.2 T.

7. A modulating apparatus according to claim 6, wherein the last 5 bits of a code word of the variable length code are all 0 except when the binding length r of the digital data is 1.

8. A modulating method according to claim 7, wherein the basic data length m of the digital data is 2, 4, 6, 8 or 10 while the basic code length n of the variable length code is 5, 10, 15, 20 or 25.

9. A demodulating apparatus for demodulating a variable length code (d, k;m, n;r) of a basic code length of n bits into digital data of a basic data length of m bits, comprising:

storage means for storing therein a plurality of tables for converting the variable length code wherein, where the distance between adjacent ones of the digital data is represented by T, the minimum reversal distance Tmin is equal to or greater than 2.0 T and the minimum length d of a run of a same symbol is equal to or greater than 4 into the digital data;

discriminating means for discriminating the conversion length of the variable length code; and selecting means for selecting one of the tables in said storage means in accordance with a result of discrimination of said discriminating means.

10. A demodulating apparatus according to claim 9, wherein the maximum reversal distance Tmax of the variable length code is equal to or smaller than 9.2 T.

11. A demodulating apparatus according to claim 10, wherein the last 5 bits of a code word of the variable length code are all 0 except when the binding length r of the digital data is 1.

12. A demodulating apparatus according to claim 11, wherein the basic code length n of the variable length code is 5, 10, 15, 20 or 25 while the basic data length m of the digital data is 2, 4, 6, 8 or 10.

13. A modulating apparatus for modulating digital data of a basic data length of m bits into a variable length code (d, k;m, n;r) of a basic code length of n bits, comprising:

storage means for storing therein a plurality of tables for converting the digital data into the variable length code wherein, where the distance between adjacent ones of the digital data is represented by T, the minimum reversal distance Tmin of the variable length code is equal to or greater than 2.0 T, the maximum reversal distance Tmax is equal to or smaller than 9.2 T, the minimum length d of a run of a same symbol is equal to or greater than 4, the last 5 bits of a code word of the variable length code are all 0 except when the binding length r of the digital data is 1, and the binding length r of the variable length code is equal to r=5;

discriminating means for discriminating the binding length r of the digital data; and selecting means for selecting one of the tables in said storage means in accordance with a result of discrimination of said discriminating means.

14. A demodulating apparatus for demodulating a variable length code (d, k;m, n;r) of a basic code length of n bits into digital data of a basic data length of m bits, comprising:

storage means for storing therein a plurality of tables for converting the variable length code wherein, where the distance between adjacent ones of the digital data is represented by T, the minimum reversal distance Tmin of the variable length code is equal to or greater than 2.0 T, the maximum reversal distance Tmax is equal to or smaller than 9.2 T, the minimum length d of a run of a same symbol is equal to or greater than 4, the last 5 bits of a code word of the variable length code are all 0 except when the binding length r of the digital data is 1, and the binding length r of the variable length code is equal to r=5 into the digital data;

discriminating means for discriminating the conversion length of the variable length code; and selecting means for selecting one of the tables in said storage means in accordance with a result of discrimination of said discriminating means.

15. A method for modulating digital data of a basic data length of m bits into a variable length code (d, k;m, n;r) of a basic code length of n bits, comprising:

discriminating the basic data length m of a sequence of digital data bits; and converting the sequence of digital data bits into a code word, wherein, each time the basic data length m of the data varies by a predetermined number of bits, the basic code length n of the code is varied at least n1 bits or n2 bits in accordance with at least two different predetermined conversion tables, where n1 is different from n2.

16. The modulating method of claim 15, wherein the value of d, representing the minimum number of successive same symbols in the code is 3, the distance between adjacent ones of the digital data is represented by T, and the minimum reversal distance Tmin of the variable length code is equal to or greater than 1.78 T.

17. The modulating method of claim 15, wherein the maximum reversal distance Tmax of the variable length code is equal to or smaller than 7.1 T.

18. The modulating method of claims 15 or 17, wherein one of the conversion tables converts the digital data into a code of 4, 9, 13, 18 or 22 bits when the digital data is 2, 4, 6, 8 or 10 bits, respectively, and another one of the conversion tables converts the digital data into a code of 5, 9, 14 or 18 bits when the digital data is 2, 4, 6 or 8 bits, respectively.

19. A modulating apparatus for modulating digital data of a basic data length of m bits into a variable length code (d, k;m, n;r) of a basic code length of n bits, comprising:

first storage means for storing therein a first conversion table for successively varying the basic code length n of the variable length code by n1 bits or n2 bits each time the basic data length m of the digital data varies by a predetermined number of bits, n1 being different from n2;

second storage means for storing therein a second conversion table for successively varying the basic code length n of the variable length code by n2 bits or n1 bits each time the basic data length m of the digital data varies by the predetermined number of bits; and composing means for composing the code words of the variable length code after conversion in accordance with the first and the second conversion tables.

20. A demodulating apparatus for demodulating a variable length code (d, k;m, n;r) of a basic code length of n bits into digital data a basic data length of m bits, comprising:

first storage means for storing therein a first conversion table for converting the variable length code into the digital data so that the basic data length m of the digital data may be successively varied by a predetermined number of bits each time the basic code length n of the variable length code successively varies by n1 bits or n2 bits, n1 being different from n2;

second storage means for storing therein a second conversion table for converting the variable length code into the digital data so that the basic data length m of the digital data may be successively varied by the predetermined number of bits each time the basic code length n of the variable length code successively varies by n2 bits or n1 bits; and composing means for composing the digital data after conversion in accordance with the first and second conversion tables.

21. A demodulating apparatus according to claim 20, wherein the value of d is 3, and where the distance between adjacent ones of the digital data is represented by T, the minimum reversal distance Tmin of the variable length code is equal to or greater than 1.78 T.

22. A demodulating apparatus according to claim 21, wherein the maximum reversal distance Tmax of the variable length code is equal to or smaller than 7.1 T.

23. A demodulating apparatus according to claim 20, 21 or 22, wherein one of the conversion tables converts the variable length code into the digital data of 2, 4, 6, 8 or 10 bits when the variable length code is 4, 9, 13, 18 or 22 bits, respectively, and another one of the conversion tables converts the variable length code into the digital data of 2, 4, 6 or 8 bits when the variable length code is 5, 9, 14 or 18 bits, respectively.

24. A modulating apparatus for modulating digital data of a basic data length of m bits into a variable length code (d, k;m, n;r) of a basic code length of n bits, comprising:

first converting means for inputting the digital data and converting the input digital data into a first code train in accordance with a first conversion table;

second converting means for inputting the digital data and converting the input digital data into a second code train in accordance with a second conversion table;

multiplexing means for receiving the first code train from said first converting means and the second code train from said second converting means; and timing managing means for inputting the digital data, detecting a boundary of a block of the input digital data based on a synchronizing signal, and sending out, when a boundary of a block is detected, a control signal to said multiplexing means so that the output of said multiplexing means is changed over from the first code train from said first converting means to the second code train from said second converting means.

25. A modulating apparatus according to claim 24, wherein the variable length code (d, k;m, n;r) is defined as a code wherein, where the distance between adjacent ones of the digital data is represented by T, the minimum reversal distance Tmin is equal to or greater than 2.0 T, the minimum length d of a run of a same symbol is equal to or greater than 4, and the maximum reversal distance Tmax is equal to or smaller than 9.2 T.

26. A demodulating apparatus for demodulating a variable length code (d, k;m, n;r) of a basic code length of n bits into digital data of a basic data length of m bits, comprising:

first converting means for inputting the variable length code and converting the input variable length code into first demodulation data in accordance with a first conversion table;

second converting means for inputting the variable length code and converting the input variable length code into second demodulation data in accordance with a second conversion table;

multiplexing means for receiving the first demodulation data from said first converting means and the second demodulation data from said second converting means; and timing managing means for inputting the variable length code, detecting a particular code train from the input variable length code and sending out, when the particular code train is detected, a control signal to said multiplexing means so that the output of said multiplexing means is changed over from the second demodulation data from said second converting means to the first demodulation data from said first converting means.

27. A demodulating apparatus according to claim 26, wherein the variable length code (d, k;m, n;r) is defined as a code wherein, where the distance between adjacent ones of the digital data is represented by T, the minimum reversal distance Tmin is equal to or greater than 2.0 T, the minimum length d of a run of a same symbol is equal to or greater than 4, and the maximum reversal distance Tmax is equal to or smaller than 9.2 T.

* * * * *